United States Patent
Brinkmann et al.

(10) Patent No.: US 6,524,448 B2
(45) Date of Patent: Feb. 25, 2003

(54) CONFIGURATION FOR THE EXECUTION OF A PLASMA BASED SPUTTER PROCESS

(75) Inventors: Ralf-Peter Brinkmann, München (DE); Alfred Kersch, Putzbrunn (DE)

(73) Assignee: Infineon Technologies AG, München (DE)

( * ) Notice: Subject to any disclaimer, the term of this patent is extended or adjusted under 35 U.S.C. 154(b) by 0 days.

(21) Appl. No.: 09/832,988

(22) Filed: Apr. 11, 2001

(65) Prior Publication Data

US 2002/0036132 A1 Mar. 28, 2002

(30) Foreign Application Priority Data

Apr. 11, 2000 (DE) .......................................... 100 18 015

(51) Int. Cl.[7] .............................................. C23C 14/35
(52) U.S. Cl. .......................... 204/192.12; 204/298.06; 204/298.16; 204/298.37
(58) Field of Search ........................ 204/192.12, 298.06, 204/298.16, 298.28, 298.37

(56) References Cited

U.S. PATENT DOCUMENTS

| 5,178,739 | A | * | 1/1993 | Barnes et al. ........... 204/192.12 |
|---|---|---|---|---|
| 5,225,024 | A | * | 7/1993 | Hanley et al. ............... 156/345 |
| 5,423,915 | A | | 6/1995 | Murata et al. ........... 118/723 E |
| 5,534,108 | A | | 7/1996 | Qian et al. ................ 156/643.1 |
| 5,980,687 | A | | 11/1999 | Koshimizu ................... 156/345 |
| 6,082,293 | A | | 7/2000 | Kawashima ............ 118/723 E |

OTHER PUBLICATIONS

Japan 61 086942 A abstract.
Japan 63 277 779 A abstract.
Japan 09 283 300 A abstract.

* cited by examiner

*Primary Examiner*—Steven H. VerSteeg
(74) *Attorney, Agent, or Firm*—Laurence A. Greenberg; Werner H. Stemer; Ralph E. Locher

(57) ABSTRACT

The present invention relates to a system for executing a plasma-based sputtering method, such as for example a PVD (Physical Vapor Deposition) method. In a process chamber (1), a plasma (2) is produced in order to accelerate ionized particles, carried away from a sputter target (21), through the plasma (2) towards a substrate (3), using an electrical field. In the process chamber (1), between the plasma (2) and the substrate (3) a magnetic field component (6) is produced by that is situated parallel to a substrate surface (5). Through the magnetic field component (6), the angular distribution of the ionized particles is deflected from its flight path perpendicular to the substrate surface, so that impact angles are produced that have a greater angular scattering.

11 Claims, 6 Drawing Sheets

CONFIGURATION FOR THE EXECUTION OF A PLASMA BASED SPUTTER PROCESS

BACKGROUND OF THE INVENTION

Field of the Invention

The present invention relates to a system and to a method for executing a plasma-based sputtering method, such as for example a PVD (Physical Vapor Deposition) method.

Layer deposition methods and structuring methods are used to manufacture microelectronic and microcircuitry components. For example, for depositing metals PVD (Physical Vapor Deposition) processes, also called sputtering processes, can be used. For the layer deposition of silicon or of dielectrics, for example CVD (Chemical Vapor Deposition) or PECVD (Plasma Enhanced CVD) processes are used. For structuring, for example dry etching processes with ionized atoms or molecules are used. These methods have in common that they are executed in a process chamber using a plasma.

The structures arranged on a substrate, such as for example trenches, have an aspect ratio (ratio of trench depth to trench diameter) that increases as the miniaturization of microelectronic components progresses.

Therefore, to an ever-greater degree, methods having a controllable directional characteristic are required. A known method having a directional characteristic is for example the directional deposition of metals in contact holes and printed conductors with the aid of an ionized metal plasma. The direction of the deposition results from an accelerating voltage that accelerates the ionized metal particles towards the substrate.

The directional deposition of dielectrics by means of ionized particles from high-density plasmas, and anisotropic dry etching using ionized atoms or molecules, are likewise possible.

Many of the directional etching and deposition methods are plasma-based, and exploit the effect that the electrical fields that are present have on the motion of the particles ionized in a plasma. The plasmas in question are for example what are known as high-density plasmas (HDP), at gas pressures in the range from 1 to 100 mTorr. The plasma thereby performs two functions. First, it produces the ionized particles in the plasma, and, second, on the basis of the always-present electrical field—possibly modified from the outside—it accelerates these particles in the direction towards the substrate to be processed. Between the substrate and a plasma, in the vicinity of the substrate a thin boundary layer standardly forms, where the electrical fields are always oriented perpendicular to the substrate. The voltage drop in the boundary layer can be estimated using the formula:

$$\Delta V \approx \log\left(\sqrt{\frac{m_i}{m_e}}\right)\frac{T_e}{e} \approx 10 \ldots 30 \text{ V}.$$

Here $m_i$ and $m_e$ are the masses of the ions and electrons, $T_e$ is the electron temperature in the plasma, and e is the elementary charge. The voltage in the boundary layer can be increased to several 100 V using an applied external voltage. In addition, located between the boundary layer and the plasma is what is known as a pre-layer, which has an extension of several mean free path lengths λ (mean path that covers the distance between two impacts), so that it is several centimeters wide and is therefore considerably more extended than is the boundary layer. The overall voltage drop here is in the range of the thermal voltage for electrons and is approximately $$\Delta V \approx \frac{T_e}{e} \approx 3 \text{ V}$$

and cannot be modified directly from the outside. Due to the extension of the pre-layer, the field is oriented perpendicular to the substrate only to a first approximation, so that geometric effects of the process chamber can cause a certain deviation from the perpendicular.

The angular distribution and energy distribution of the ionized particles impacting on the substrate is determined by the transport through the boundary layer and the pre-layer, in which the particles receive an impulse that has a component oriented perpendicular to the substrate surface and a component oriented tangential to the substrate surface. When the particles leave the plasma, they have for the most part only a very small perpendicular and tangential impulse. From the electrical field of the pre-layer and of the boundary layer, the particles can receive only a perpendicular impulse, because the electrical field is oriented perpendicular to the substrate surface. The particles can receive an impulse oriented tangentially to the substrate surface only through deflecting impacts with the process gas in the process chamber. In the thin boundary layer, these impacts are very improbable, while in the broader pre-layer these impacts are more probable, but the ion energy here is considerably less. Through this mechanism, the tangential impulse is limited to approximately $\sqrt{m_i T_e}$, so that the angular distribution of the ions, which deviates from the perpendicular to the substrate, is very small.

The perpendicular impulse is $\sqrt{20 m_i T_e}$; the ion energy in the pre-layer is approximately $T_e$.

Fields additionally coupled in, such as a direct voltage field (DC) or an alternating voltage field (RF), enlarge or modulate the voltage drop in the boundary layer, and thereby modify the component of the particle impulse that is oriented perpendicular to the substrate surface. These fields have no significant influence on the tangential component of the impulse.

For this reason, in conventional plasma processes the possibilities for controlling the energy distribution and angular distribution of the impacting particles are very limited. As stated above, the impulse of the ionized particles can be influenced only in its magnitude, but not in its direction.

The non-ionized particles impacting on the substrate, which in some circumstances can also be relevant for the process, are not influenced by the electrical fields existing in the pre-layer and in the boundary layer, because they do not interact with them. Therefore, neither the angular distribution nor the impact energy can be influenced by the non-ionized particles. However, there is a possibility of indirect control via the degree of ionization of the particles, whereby the ratio of the ionized particles that impact directionally on the substrate to the non-ionized particles that impact non-directionally (isotropically) on the substrate is influenced, and in this way the portion of particles impacting directionally and the portion of particles impacting non-directionally on the substrate surface can be adjusted.

In the cited directional processes, it is problematic that, due to the field arrangement of the acceleration voltage, the ions are accelerated exclusively perpendicularly towards the substrate surface. In many cases, this limited possibility of controlling the angular distribution is not sufficient. A typical example is the deposition of a metal in a contact hole with a large aspect ratio. Using an IPVD (Ionized Physical Vapor Deposition) method, it is predominantly achieved that the contact hole is not closed prematurely in the upper region, as is the case in non-ionized processes. For this reason, first as large a portion as possible of the metal atoms in the plasma are ionized, so that the flow of neutral metal atoms into the contact hole is minimal. The angular distribution of the neutral metal atoms is nearly isotropic, and would result in a premature closing of the upper region of the contact hole, before the contact hole is filled at the floor. The angular distribution of the ionized particles, in contrast, is predominantly oriented in perpendicular fashion, so that even given the absence of an additional bias (DC, RF), most of the particles impact on the substrate surface within an angle of 10 degrees from the perpendicular. The ionized particles reach the floor of the contact hole, but only seldom reach the side wall. In many cases, however, a thick deposition on the side wall is desired, which cannot be achieved by the low angular distribution of less than 10 degrees. An angular distribution beyond the mentioned 10 degrees would therefore be desirable.

SUMMARY OF THE INVENTION

The object of the invention is to indicate a system for executing a plasma-based sputtering method, as well as a plasma-based sputtering method, that enables an increased angular distribution of the ionized particles.

With respect to the system, the object is achieved through a system for executing a plasma-based sputtering method, having:

- a process chamber in which a plasma can be produced;
- a sputter target that is situated in the process chamber;
- a substrate bearer that is situated inside the process chamber and on which a substrate having a substrate surface can be arranged, and
- a magnetic field that can be produced in the process chamber between the plasma and the substrate and that has a magnetic field component that runs parallel to the substrate surface.

The inventive system enables an additional scattering of the particles in the pre-layer and in the boundary layer, with which the angular distribution of the particles impacting on the substrate can be adjusted. The invention exploits the fact that electrically charged particles are influenced by magnetic fields. The influence of a magnetic field on the motion of a charged particle is determined by the Lorentz force $F=q \cdot v \times B$. This means that the electrical charge is accelerated and deflected during its movement through a magnetic field B. Here the magnetic field component that acts is the one standing perpendicular to the motion of the charge. The particle charged with charge q moves in magnetic field B with velocity v. If, for example, magnetic field B is oriented parallel to the substrate surface, and if the ionized particles move towards the substrate in perpendicular fashion, the charged particle is deflected perpendicular to its direction of motion and perpendicular to the magnetic field. Through the deflection of the charged particles, it is possible to deflect their flight path from the perpendicular to the substrate, by which means the ionized particles impact not only on the trench floor, but also on the trench side wall.

The advantage of the invention is that the distribution of the ions is modified directly by the magnetic field, and also leads to a broadening of the angular distribution.

A variant of the invention provides that the magnetic field component can be rotated about an axis that runs perpendicular to the substrate surface. In the case of a static magnetic field that does not rotate, the ionized particles are always deflected in the same direction. In order to enable the deflection of the ionized particles in other directions as well to the substrate surface, the magnetic field is rotated relative to the substrate surface and maintains its orientation parallel to the substrate surface.

A further construction of the invention provides that the magnetic field component can be produced using a coil through which current flows. The coil through which current flows enables the variation of the magnetic field strength in an advantageous manner.

In addition, it is provided that the magnetic field component is produced using a permanent magnet. A permanent magnet enables, for example, the compact arrangement of the magnet in the process chamber or in the substrate bearer, enabling an efficient design.

A further arrangement provides that the coil is situated outside the process chamber. The arrangement of the coil outside the process chamber enables a simple retrofitting of existing equipment, and offers a simple and direct access to coils producing the magnetic field.

In addition, it is provided that a second coil forms, together with the first coil, a Helmholtz coil system. A Helmholtz coil system has the advantage that it enables a very uniform and homogeneous magnetic field.

A further embodiment of the inventive system provides that the coil can be rotated about the substrate bearer. In this way, a rotating magnetic field is enabled that forms the angular distribution of the ionized particles uniformly about an axis standing perpendicular to the substrate. The rotating coil thereby enables the rotating magnetic field.

In addition, it is provided that the magnetic field component can be modified and has no direct portion in its time average. This means that the angular distribution of the ionized particles is formed in rotationally symmetrical fashion about an axis that is oriented perpendicular to the substrate surface. This procedure has the advantage that the ionized particles impact on trench walls and on the substrate surface in uniform fashion.

A development of the invention provides that the permanent magnet is situated underneath the substrate in the process chamber. This position for the permanent magnet is particularly suitable because it can be arranged directly in the substrate bearer, which is situated close to the substrate and therefore close to the boundary layer or to the pre-layer, and thereby produces a sufficiently strong magnetic field.

In a further construction of the invention, the permanent magnet can be rotated about an axis. The rotation of the permanent magnet produces a rotating magnetic field, producing an angular distribution of the ionized particles in various spatial directions.

In addition, it is advantageous to produce the magnetic field component using two crossed Helmholtz coil systems. The crossed Helmholtz coil systems enable the production of a rotating magnetic field.

In a development, it is provided that the magnetic field component is variable in its direction and strength. This has the advantage that the angular distribution of the ionized particles can be adjusted. In addition, it is possible to produce a symmetrical angular distribution in relation to an axis of rotation, or an asymmetrical angular distribution having a preferred direction.

A further advantageous construction of the invention provides that the magnetic field component can be modified in its direction and strength by means of a flow of current through a coil. The use of a flow of current enables the production, controlling and regulation of a magnetic field.

With respect to the method, the object is achieved by a method for executing a plasma-based sputtering method having the steps:

provision of a process chamber in which a sputter target and a substrate bearer are arranged;

arranging of a substrate having a substrate surface in the process chamber, on the substrate bearer;

production of a plasma in the process chamber, whereby material is carried away from the sputter target and is deposited on the substrate surface;

production of a magnetic field in the process chamber between the plasma and the substrate, whereby the magnetic field has a magnetic field component that runs parallel to the substrate surface.

The inventive method enables the execution of a sputtering process that leads to an improved edge covering and improved results for deposition in a trench.

The inventive method enables the magnetic field component to be rotated about an axis that runs perpendicular to the substrate surface.

Additional advantageous constructions of the invention are the subject matter of the respective subclaims.

Exemplary embodiments of the invention are presented and explained below on the basis of figures.

DESCRIPTION OF THE PREFERRED EMBODIMENT

Figure 1:
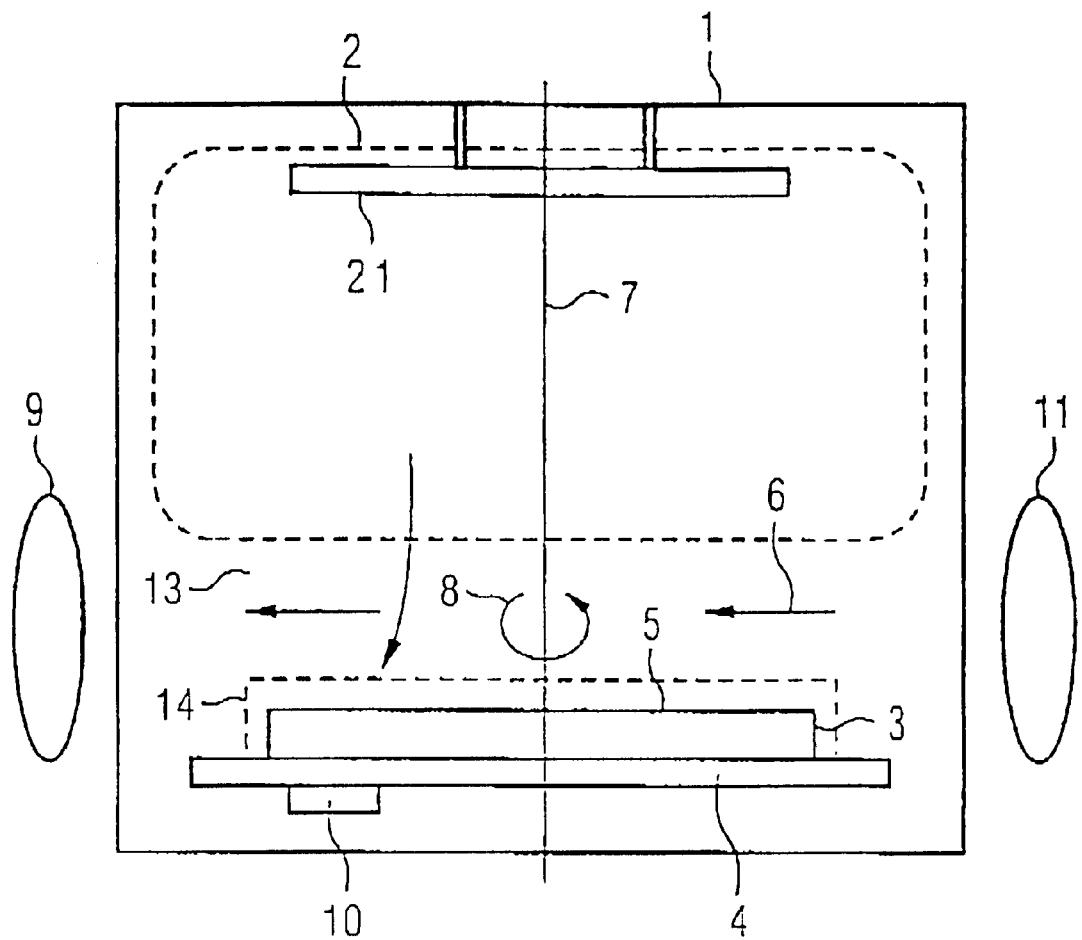
FIG. 1 shows a process chamber.

In FIG. 1, a process chamber 1 is shown. In process chamber 1, a plasma 2 has been produced. In addition, in process chamber 1 there is located a substrate bearer 4 on which a substrate 3 having a substrate surface 5 is situated. A sputter target 21 for a sputtering process is situated in process chamber 1. During a sputtering process, the material of sputter target 21 is carried away from sputter target 21 and is sputtered onto substrate surface 5 of substrate 3 situated in process chamber 1.

Between plasma 2 and substrate 3 there is located a pre-layer 13 and an boundary layer 14, boundary layer 14 being situated in the immediate vicinity of the substrate. In pre-layer 13 and in boundary layer 14 there is located a magnetic field component 6 that is situated parallel to substrate surface 5. With respect to an axis 7 that is conceived to be perpendicular to the substrate surface, magnetic field component 6 can execute a rotation 8 about axis 7. In addition, a coil 9 and a permanent magnet 10 are arranged for the production of magnetic field component 6. Coil 9 can for example be situated inside or outside process chamber 1, and can form, together with a second coil 11, a Helmholtz coil system. In this exemplary embodiment, permanent magnet 10 is situated in the process chamber underneath substrate 3. Permanent magnet 10 can for example rotate about axis 7 or about its own axis.

Figure 2:
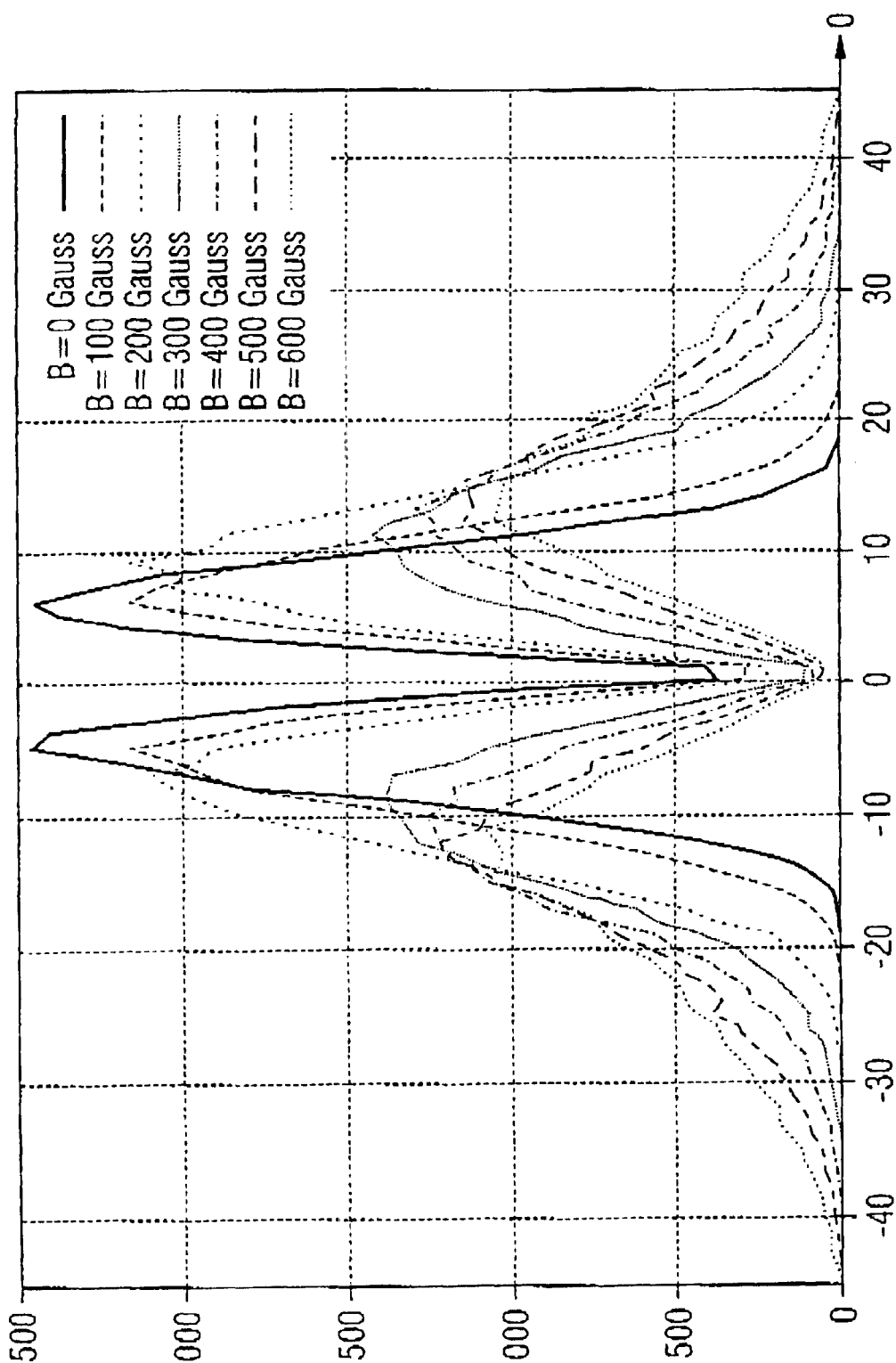
FIG. 2 shows a simulated angular distribution of titanium ions with a degree of ionization of 100%, dependent on the magnetic field component.

In FIG. 2, a simulated angular distribution of titanium ions for a sputtering process is shown, in which titanium from a titanium target is sputtered onto a substrate situated in the process chamber. On the abscissa, the deviation from the perpendicular to the substrate is shown in degrees, and on the ordinate the particle flow associated with this angular deviation is shown in arbitrary units. The degree of ionization of the titanium ions simulated in this example is 100%. The various curves in the diagram are associated with magnetic fields of different strengths. It can be seen clearly that, given a switched-off magnetic field (B=0 Gauss), the angular distribution is situated in a very narrow range about the substrate normal. If the magnetic field is increased, it can be seen that the particle flow increases in the direction of greater angles of deviation to the substrate normal.

Figure 3:
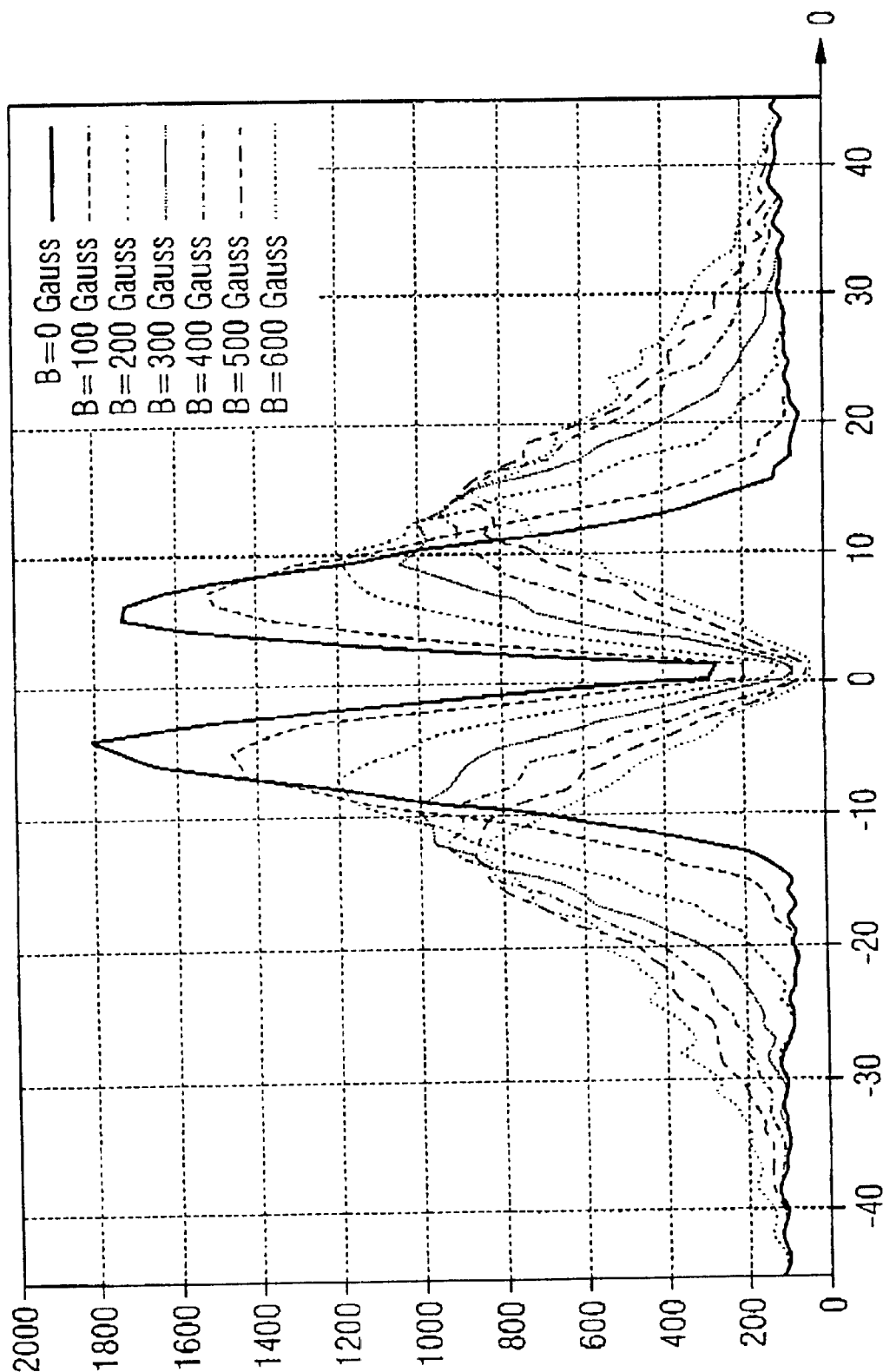
FIG. 3 shows a simulated angular distribution of titanium ions with a degree of ionization of 70%, dependent on the magnetic field.

In FIG. 3, a simulation corresponding to FIG. 2 has been carried out. In this case, however, the degree of ionization of the titanium ions is assumed to be 70%. This means that 30% of the titanium particles have not been ionized, and are therefore influenced neither by a magnetic field nor by an electrical field. For this case as well, on the abscissa the angular deviation from the substrate normal is shown in degrees, and on the ordinate the corresponding particle flow is shown in arbitrary units. Here as well, it can be seen that, given a switched-off magnetic field, the particle flow takes place in a very narrow angular range about the substrate normal. For increasing magnetic fields, the particle flow clearly increases for impact angles with greater angular deviation.

Figure 4:
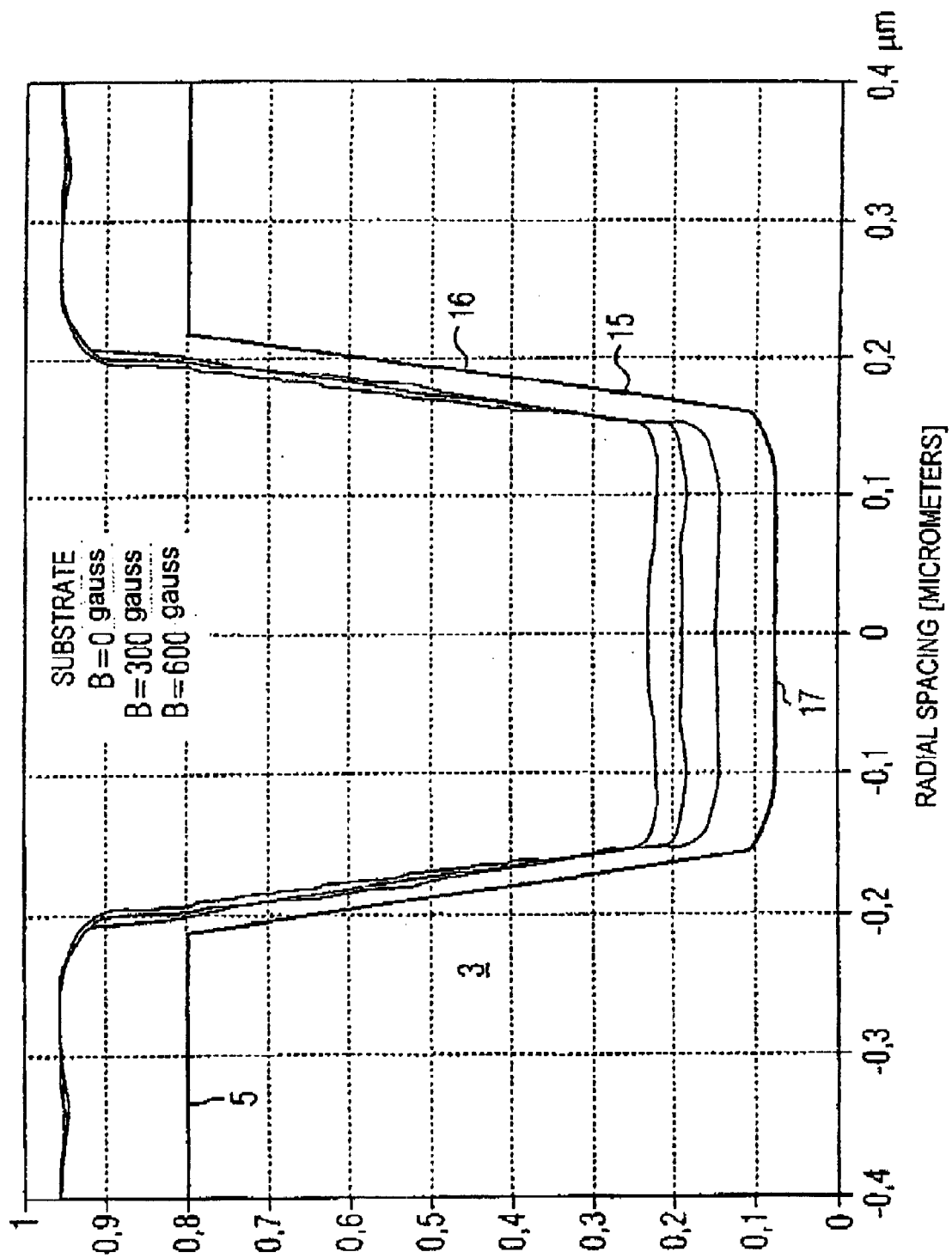
FIG. 4 shows a simulated edge covering of a contact hole with titanium, dependent on the strength of the magnetic field, having the corresponding angular distribution from FIG. 2, with a degree of ionization of 100%.

In FIG. 4, a titanium deposition has been simulated. A substrate 3 having a substrate surface 5 and a trench 15 situated in the substrate 3 are shown. Trench 15 has a side wall 16 and a floor 17. A titanium deposition has been simulated, whereby simulations have been assumed without a magnetic field, with a magnetic field of 300 Gauss, and with a magnetic field of 600 Gauss. The side wall covering is improved from 8% to 14% when the magnetic field is increased from 0 to 600 Gauss.

Figure 5:
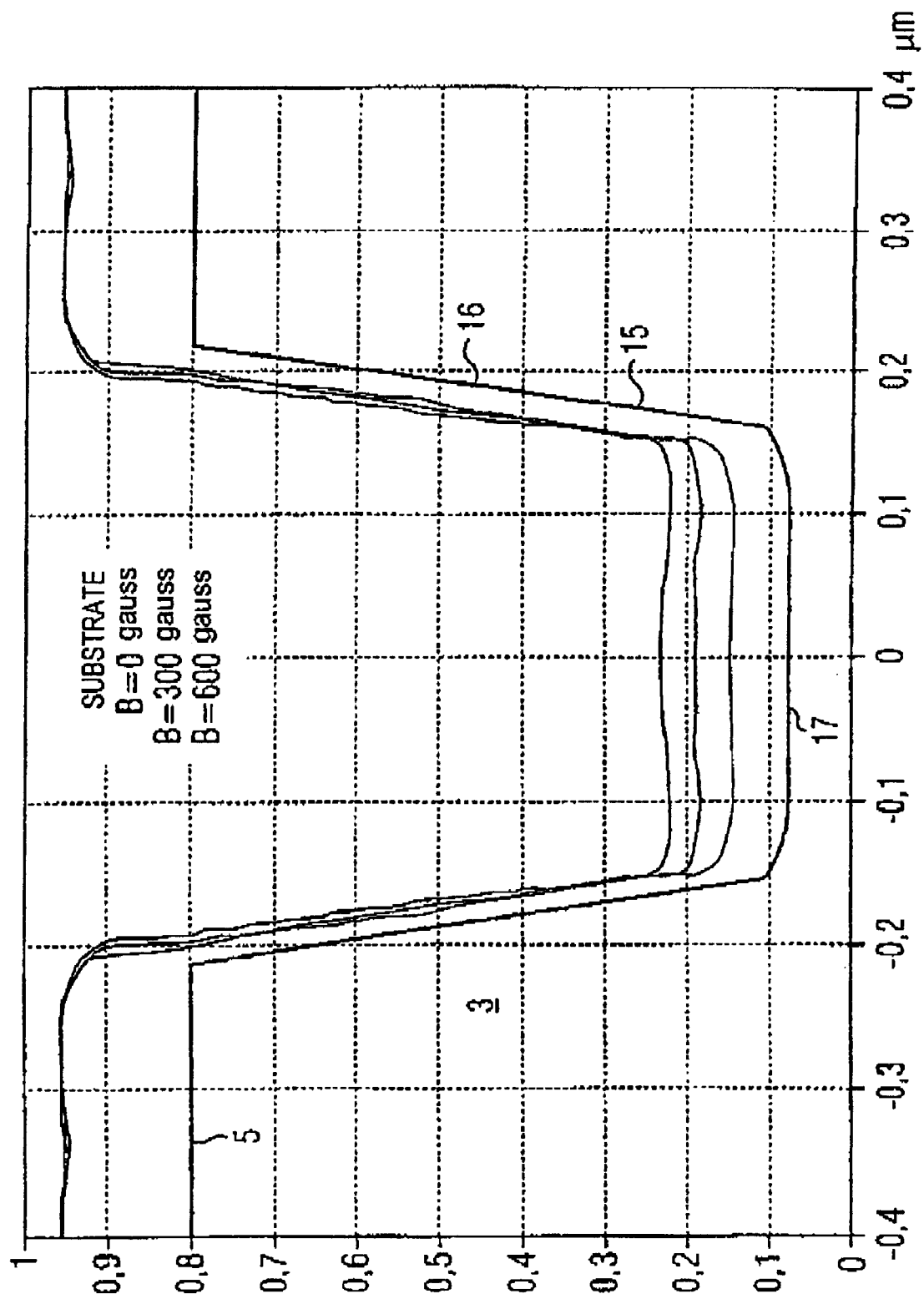
FIG. 5 shows a simulated edge covering of a contact hole with titanium, dependent on the strength of the magnetic field, in relation to the angular distribution from FIG. 3, with a degree of ionization of 70%.

In FIG. 5, a further simulation is shown in which a substrate 3 having a trench 15 is likewise used. Trench 15 has a side wall 16 and a trench floor 17.

In this case of simulation, the degree of ionization of the titanium particles was assumed to be 70%. Likewise, magnetic fields of 0 Gauss, 300 Gauss, and 600 Gauss were simulated. In this case as well, the side wall covering was improved.

Figure 6:
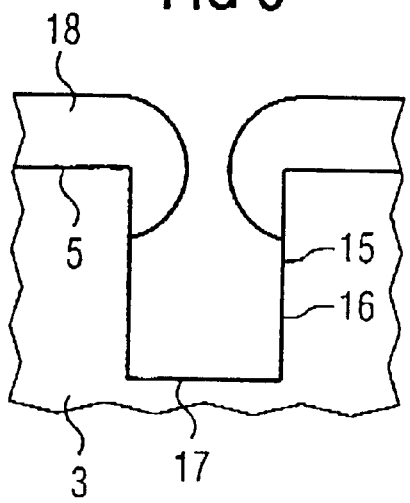
FIG. 6 shows a deposition with isotropic particle flow.

In FIG. 6, a substrate 3 having a trench 15 is shown that has a trench side wall 16 and a trench floor 17. A deposited layer 18 is shown on substrate surface 5. In the case shown here, a sputtering method was used in which the rate of ionization of the sputtered-on material was selected to be very low. This results in the depicted depositing of the material, preferably in the region of the opening of the trench.

Figure 7:
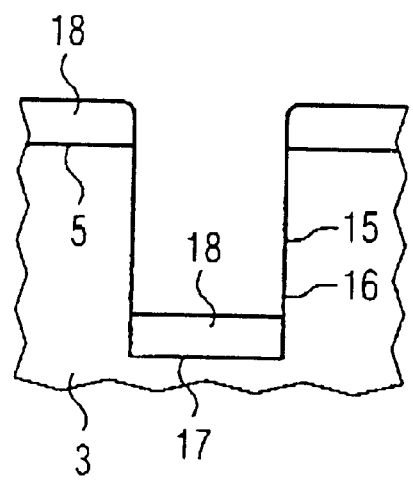
FIG. 7 shows a deposition with anisotropic particle flow.

In FIG. 7, a further example of a deposited layer 18 is shown. Layer 18 is deposited on substrate surface 5 of a substrate 3 in which a trench 15 is formed having a trench side wall 16 and a trench floor 17. This exemplary embodiment shows a typical deposition using a directional deposition method. In this case, the rate of ionization of the particles to be deposited has been selected to be very high, so that the particles in the pre-layer and in the boundary layer are accelerated and impact in almost perpendicular fashion on the substrate and on trench floor 17. The trench side walls are almost without covering.

Figure 8:
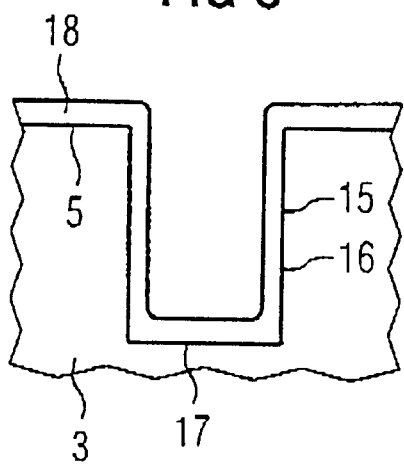
FIG. 8 shows a deposition with improved edge covering.

With reference to FIG. 8, a deposition is shown that deposits significantly more material on trench side wall 16 of a trench 15. In this exemplary embodiment, trench 15 is formed in a substrate 3 having a substrate surface 5.

Figure 9:
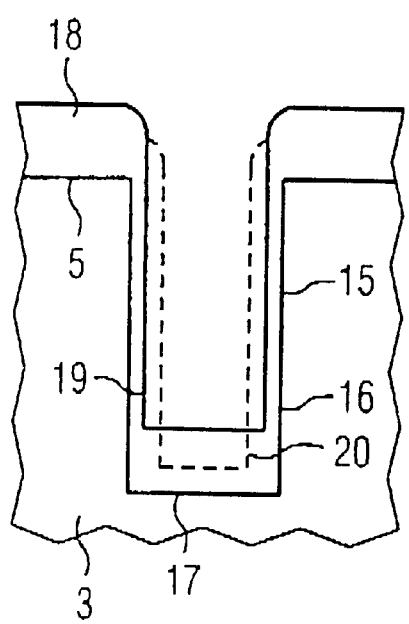
FIG. 9 shows a comparison between a deposition without and with the inventive magnetic field.

In FIG. 9, a substrate 3 is shown that has a substrate surface 5. In substrate 3, there is situated a trench 15 having a trench side wall 16 and a trench floor 17. A layer 18 has been deposited on substrate surface 5 and in trench 15. In this exemplary embodiment, the deposition along solid line 19 has been executed without the inventive magnetic field, and dotted line 20 shows the result of the deposition of layer 18 with the use of the inventive magnetic field. Here it is typical that less material is deposited on trench floor 17, and instead reaches trench side wall 16.

In the inventive method, the directional characteristic of an ionized PVD method is controlled using a sufficiently strong magnetic field in the vicinity of the substrate (having a magnetic field component oriented tangential to the substrate surface). Ionized particles are thereby deflected from their flight path oriented perpendicular to the substrate.

In contrast, in plasma etching an isotropic angular distribution is desirable. In plasma etching, the magnetic fields are used to increase the plasma density in the process chamber.

For a PVD process with a controllable angular characteristic, in contrast, the following is required:
- a target;
- a metal plasma with metal ions;
- a static magnetic field for producing a plasma confinement in the process chamber and at the substrate, for the formation of a preferred direction of magnetization;
- a rotating magnetic field having a rotating tangential component, this magnetic field component being controllable and having a strength of 100 Gauss, and preferably several 100 Gauss.

The magnetic field strength is thus stronger than is standard. For this reason, an adaptation of the process chamber is optionally required. For example, a high process chamber is required that forms a plasma in the upper region, in the vicinity of the target, and that has the strong magnetic field in the lower region, in the vicinity of the substrate.

1 process chamber
2 plasma
3 substrate
4 substrate holder
5 substrate surface
6 magnetic field component
7 axis
8 rotation
9 coil
10 permanent magnet
11 second coil
13 pre-layer
14 boundary layer
15 trench
16 trench side wall
17 trench floor
18 deposited layer
19 first deposition variant
20 second deposition variant
21 sputter target

What is claimed is:

1. A system for executing a plasma-based sputtering method, the system comprising:
   a process chamber in which a plasma can be produced;
   a sputter target located in said process chamber;
   a substrate bearer located inside said process chamber, said substrate bearer for receiving a substrate having a substrate surface; and
   a magnetic field source for producing a magnetic field in said process chamber between the plasma and the substrate, said magnetic field source producing the magnetic field with a magnetic field component that runs parallel to the substrate surface, said magnetic field source being rotatable about said substrate bearer.

2. The system according to claim 1, wherein said magnetic field source enables the magnetic field component to be rotated about an axis that runs perpendicular to the substrate surface.

3. The system according to claim 1, wherein said magnetic field source includes a coil for receiving a current to produce the magnetic field component.

4. The system according to claim 3, wherein said coil is located outside said process chamber.

5. The system according to claim 3, wherein said magnetic field source forms a Helmholtz coil system that includes said coil and a second coil.

6. The system according to claim 1, wherein said magnetic field source includes a permanent magnet for producing the magnetic field component.

7. The system according to claim 1, wherein said magnetic field source enables modification of the magnetic field component such that the magnetic field component does not comprise a direct portion in its time average.

8. A system for executing a plasma-based sputtering method, the system comprising:
   a process chamber in which a plasma can be produced;
   a sputter target located in said process chamber;
   a substrate bearer located inside said process chamber, said substrate bearer for receiving a substrate having a substrate surface; and
   a magnetic field source for producing a magnetic field in said process chamber between the plasma and the substrate, said magnetic field source producing the magnetic field with a magnetic field component that runs parallel to the substrate surface, said magnetic field source including two crossed Helmholtz coil systems that produce the magnetic field component.

9. The system according to claim 8, wherein said magnetic field source enables the magnetic field component to be rotated about an axis that runs perpendicular to the substrate surface.

10. The system according to claim 8, wherein said magnetic field source enables modification of the magnetic field component such that the magnetic field component does not contain a direct portion in its time average.

11. A method for executing a plasma-based sputtering method, which comprises:
   providing a process chamber in which a sputter target and a substrate bearer are located;
   configuring a substrate having a substrate surface on the substrate bearer in the process chamber;

producing a plasma in the process chamber such that material is carried away from the sputter target and is deposited on the substrate surface;

producing a magnetic field in the process chamber between the plasma and the substrate such that the magnetic field has a magnetic field component that runs parallel to the substrate surface; and generating the magnetic field component rotating about an axis that runs perpendicular to the substrate surface by rotating a magnetic field source about the substrate bearer.

* * * * *